(12) United States Patent
Nozaki et al.

(10) Patent No.: US 6,271,554 B1
(45) Date of Patent: Aug. 7, 2001

(54) SOLID-STATE IMAGE SENSOR HAVING A SUBSTRATE WITH AN IMPURITY CONCENTRATION GRADIENT

(75) Inventors: Hidetoshi Nozaki, Yokohama (JP); Hirofumi Yamashita, Cambridge, MA (US); Hisanori Ihara; Tetsuya Yamaguchi, both of Yokohama (JP); Ikuko Inoue, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/110,074

(22) Filed: Jul. 2, 1998

(30) Foreign Application Priority Data

Jul. 4, 1997 (JP) .................................................. 9-179923

(51) Int. Cl.$^7$ ........................ H01L 27/146; H01L 31/068
(52) U.S. Cl. .......................... 257/292; 257/443; 257/463
(58) Field of Search .................................. 257/229, 291, 257/292, 443, 446, 463

(56) References Cited

U.S. PATENT DOCUMENTS

| | | | |
|---|---|---|---|
| 4,142,200 | * | 2/1979 | Mizushima et al. .................. 257/463 |
| 4,160,985 | * | 7/1979 | Kamins et al. ...................... 257/443 |
| 4,247,862 | * | 1/1981 | Klein .................................. 257/297 |
| 4,348,690 | * | 9/1982 | Jastrzebski et al. ................. 257/229 |
| 5,245,203 | | 9/1993 | Morishita et al. ................... 257/113 |
| 5,898,195 | * | 4/1999 | Harada ............................... 257/229 |
| 5,898,196 | * | 4/1999 | Hook et al. ......................... 257/292 |
| B1 4,247,862 | * | 12/1995 | Klein et al. ......................... 257/297 |

FOREIGN PATENT DOCUMENTS 61-99472    5/1986 (JP) .

* cited by examiner

*Primary Examiner*—Gene M. Munson
(74) *Attorney, Agent, or Firm*—Oblon, Spivak, McClelland, Maier & Neustadt, P.C.

(57) ABSTRACT

A solid-state image sensor comprises a semiconductor substrate, a photoelectric conversion portion formed above the semiconductor substrate, and noise cancelers each formed, adjacent to the photoelectric conversion portion, on the semiconductor substrate through an insulating film, for removing noise of a signal read from the photoelectric conversion portion, wherein the semiconductor substrate has a conductive type opposite to a conductive type of a charge of the signal, and has a first region where concentration of impurities for determining the conductive type is high and a second region where concentration of the impurities on the first region is low.

6 Claims, 7 Drawing Sheets

SOLID-STATE IMAGE SENSOR HAVING A SUBSTRATE WITH AN IMPURITY CONCENTRATION GRADIENT

BACKGROUND OF THE INVENTION

The present invention relates to a solid-state image sensor for obtaining a two-dimensional image using a photoelectric conversion effect.

Prior art will be described with reference to the drawings.

FIG. 1 is an example of the circuit diagram of a solid-state image element called "an amplifying MOS sensor".

In FIG. 1, unit cells 3×3 consisting of amplifying transistors 2-1-1, 2-1-2, . . . , 2-3-3 for reading signals of photodiodes 1-1-1, 1-1-2, . . . , 1-3-3, vertical select transistors 3-1-1, 3-1-2, . . . , 3-3-3 for selecting lines for reading signals and reset transistors 4-1-1, 4-1-2, . . . , 4-3-3 for resetting signal charges are arranged two-dimensionally.

It is noted that more unit cells are arranged in the actual device. Horizontal address lines 6-1, . . . , 6-3 connected to a vertical shift register 5 in the horizontal direction are connected to gates of vertical select transistors 3-1-1, 3-1-2, . . . , 3-3-3, respectively, to determine a line for reading a signal. Reset lines 7-1, . . . , 7-3 are connected to gates of reset transistors 4-1-1, 4-1-2, . . . , 4-3-3, respectively. Sources of the amplifying transistors 2-1-1, 2-1-2, . . . , 2-3-3 are connected to vertical signal lines 8-1, . . . , 8-3, respectively and load transistors 9-1, . . . , 9-3 are provided on one ends of the sources thereof, respectively. Other ends of the vertical signal lines 8-1, . . . , 8-3 are connected to a horizontal signal line 11 through horizontal select transistors 19-1, . . . , 19-3 selected by a select pulse supplied from a horizontal shift register 10, respectively.

FIG. 2 is an example of the sectional structure of a prior art photodiode.

In FIG. 2, a reference numeral 20 denotes a P-type semiconductor substrate having uniform impurity concentration (about $1 \times 10^{15}$ cm$^{-3}$), a reference numeral 21 denotes a P-well formed by injecting ions of P-type impurities such as boron (B) (with a concentration of about $1 \times 10^{17}$ cm$^{-3}$), a reference numeral 22 denotes an N-type region formed by injecting ions of N-type impurities such as phosphorous (P) and reference numeral 23 denotes a depletion region at a PN junction.

In the structure shown in FIG. 2, the concentration of the P-type semiconductor substrate 20 is low (i.e., high resistance) and the concentration of the P-well 21 is higher than that of the P-type semiconductor substrate 20. With such a structure, diffusion current from the P-type semiconductor substrate 20 is high and a large amount of current is generated in the depletion region 23 since crystal defects are introduced into the P-well 21 as a result of ion implantation. This causes a problem that diode dark current which is the sum of the diffusion current and the generation current is high. The prior art structure also has a problem that, due to the above reason, photo-sensitivity is low and that the phenomenon of the leakage of signal charges into adjacent photodiodes (color crosstalk) increases.

The amplifying MOS image sensor shown in FIG. 1 which has amplifying transistors (2-1-1, . . . , 2-3-3) within a unit pixel, has characteristically high sensitivity. On the other hand, it has a disadvantage in that non-uniform gate threshold voltages appear as fixed pattern noise. To get rid of that disadvantage, there is known a method of providing noise cancelers 18-1, . . . , 18-3 on ends of vertical signal lines, respectively.

FIG. 3 shows a circuit diagram wherein, the noise cancelers 18-1, . . . , 18-3 are provided. FIG. 4 shows a specific example of the noise canceler. The noise canceler 18 mainly comprises, for example, a clamp capacitance C1, a clamp transistor Tr1 for resetting a node connected to the clamp capacitance C1, a sample hold capacitance C2, a sample hold transistor Tr2 for reading a signal from the node connected to the clamp capacitance C1. The differential signal between a dark period and a bright period (light incidence period) is outputted to the vertical signal line 11 by the nose canceler. The noise cancel operation of the noise canceler is conducted for a horizontal blanking period or a short period of time such as 10.9 microseconds in a NTSC system and 3.77 microseconds in a High-Vision system. This requires therefore the transistors and capacitance which constitute the noise canceler 18 to have high-speed operation performance.

If a transistor is formed within the P-well shown in FIG. 2, the response speed of the transistor is determined by the product of the resistance of the P-well and the capacitance of the depletion layer of the source-drain region of the transistor due to the high resistance of the substrate. This is because current is supplied from a well contact formed on the P-well to the source-drain region in response to a variation in the potential of the transistor. In this case, the P-well may well have quite high concentration (or low resistance) to fasten the response speed. If so, however, it is difficult to control threshold voltage by ion implantation into the channel region of the transistor. The clamp capacitance C1 and the sample hold capacitance C2 shown in FIG. 4 are formed on an insulating film formed on the semiconductor substrate. The capacitance of the insulating film is, therefore, added to the capacitance C1 and C2 in series or in parallel. The response speed of capacitance of the insulating film is determined by the product of the P-well resistance and capacitance. For the same reason of the above-stated transistor, it is difficult to fasten the response speed.

Therefore, it is difficult to realize the high-speed operation of the transistor and the capacity which composes a noise canceler as far as it used the conventional wafer section structure shown in FIG. 2.

As described above, the prior art MOS-type solid-state image sensor has disadvantages in that dark current at the photoelectric conversion portion is high and that component noise during a dark period is large. It also has disadvantages of low sensitivity, color crosstalk and/or high degree of blooming. "Blooming" here is a phenomenon that signal charges are poured into adjacent pixels if intensifier light is incident. Moreover, the prior art MOS-type solid-state image sensor has a disadvantage in that it is difficult to realize the high-speed operation of the transistors which are the constituents of the noise canceler.

BRIEF SUMMARY OF THE INVENTION

It is an object of the present invention to realize lower dark current (less dark time noise) at the photoelectric conversion portion, higher sensitivity, less color crosstalk and less blooming, and to provide a solid-state image sensor capable of realizing the high-speed operation of noise cancelers.

The present invention has taken the following measures to attain the above object.

A solid-state image sensor according to the present invention is characterized by comprising: a semiconductor substrate; a photoelectric conversion portion formed above the semiconductor substrate; and noise cancelers each formed, adjacent to the photoelectric conversion portion, on the semiconductor substrate through an insulating film, for removing noise of a signal read from the photoelectric conversion portion, wherein the semiconductor substrate has a conductive type opposite to a conductive type of a charge of the signal, and has a first region where concentration of impurities for determining the conductive type is high and a second region where concentration of the impurities on the first region is low.

Other solid-state image sensors according to the present invention is characterized by comprising a semiconductor substrate; a photoelectric conversion portion formed above the semiconductor substrate; a third region formed above the photoelectric conversion portion, having a same conductive type as that of a first region and having almost a same impurity concentration as that of the first region; and noise cancelers each formed, adjacent to the photoelectric conversion portion, on the semiconductor substrate through an insulating film, for removing noise of a signal read from the photoelectric conversion portion, wherein the semiconductor substrate has a conductive type opposite to a conductive type of an electric charge of the signal, and has the first region where concentration of impurities for determining the conductive type is high and a second region where concentration of the impurities on the first region is low.

The preferred modes of the above-stated solid-state image sensor are as follows:

(1) The impurity concentration in the first region is $1 \times 10^{18}$ $cm^{-3}$ or higher.

(2) The impurity concentration in the second region is gradually lower toward a surface of the semiconductor substrate.

(3) The second region is formed by epitaxial growth.

(4) The second region is formed by thermal solid-phase diffusion; and the impurities are diffused from the first region toward the second region to thereby provide the impurity concentration in the second region with a desired concentration gradient.

(5) A temperature for use in the solid-phase diffusion is between 1000° and 1300° C. and diffusion time is between 10 and 480 minutes.

In the solid-state image sensor according to the present invention, most parts of the semiconductor substrate act as a high concentrated impurity region and carriers having the same conductive type as that of signal charges in that region have shorter lifetime and less mobility. This results in the reduction of substrate diffusion current components, whereby dark current can be reduced.

In addition, by gradually making impurity concentration lower toward the surface of the semiconductor substrate in the low concentrated impurity region formed on the high concentration impurity region, a potential gradient is formed toward the surface of the semiconductor substrate. Therefore, the efficiency of collecting light converted signal charges is improved, thereby capable of realizing high sensitivity. By the similar reason, such a force as to direct signal charges toward the surface of the substrate in parallel along the potential gradient is exerted to thereby make it difficult to diffuse signal charges in lateral direction.

Following the above respects, it is possible to reduce the diffusion-led leakage of signal charges in the direction of adjacent pixels, that is, to reduce color crosstalk. Likewise, blooming can be reduced by the solid-state image sensor according to the present invention. This is because blooming is mainly caused by the diffusion of signal charges in lateral direction as in the case of the leakage or color crosstalk.

Moreover, if the low concentrated impurity region having the above-stated potential gradient is formed by epitaxial growth or thermal solid-phase growth and impurity concentration in the vicinity of the surface of the semiconductor substrate is set equal to P-well concentration, then it is possible to form an impurity region having the same concentration as that of the conventional P-well without ion implantation. Due to this, it is possible to reduce generation current components in the depletion region. Thus, the present invention can provide a solid-state image sensor capable of realizing low dark current, high sensitivity, less color crosstalk and less blooming.

In addition, even if the surface of the substrate is kept at low concentration to such an extent that the threshold voltage of the transistor can be controlled, it is possible to reduce resistance for determining the response speed of the transistors and capacitance which constitute noise cancelers by providing the substrate itself with high concentration. In other words, the present invention can provide a noise canceler capable of realizing high-speed operation.

The advantages of the present invention are as follows:

The present invention can provide a solid-state device capable of obtaining low dark current, high sensitivity and less color crosstalk (as well as less blooming). Furthermore, the present invention can realize a highly refined multiple-pixel device wherein fixed pattern noise is prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments according to the present invention will now be described with reference to the drawings.

The basic circuit arrangement of the solid-state image sensor according to the present invention is the same as that of the prior art. Specific circuit diagrams as well as description thereof will not be therefore given. The present invention is characterized in that impurity concentration within the semiconductor substrate in the amplifying MOS sensor varies in the depth direction thereof.

Figure 5A:
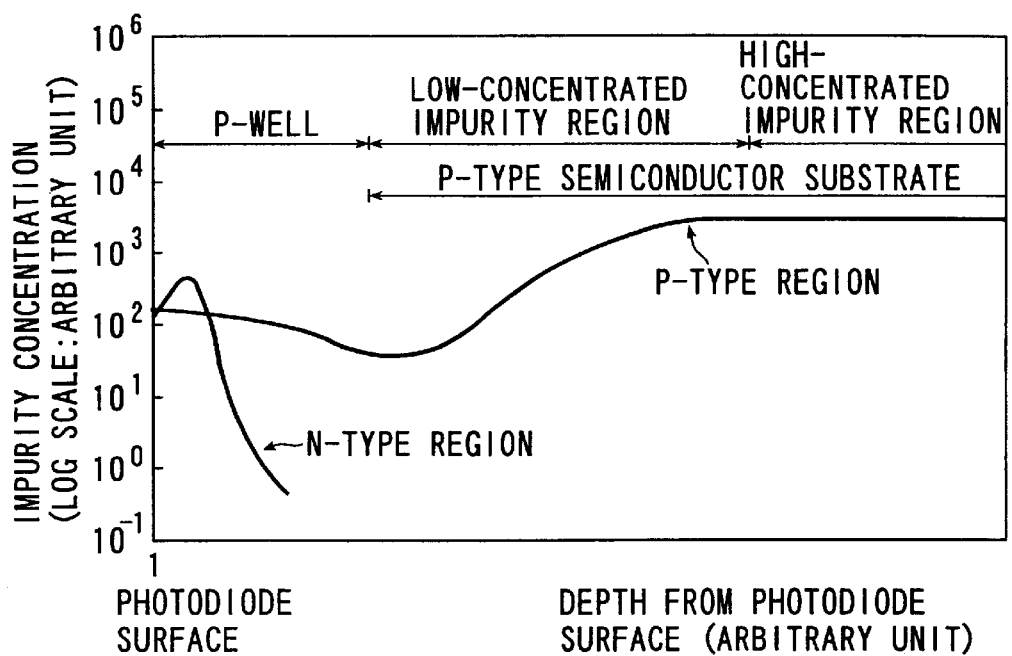
FIGS. 5A and 5B are the impurity concentration profile views of the section of the photoelectric conversion portion (or photodiode portion) according to the present invention.
Figure 5B:
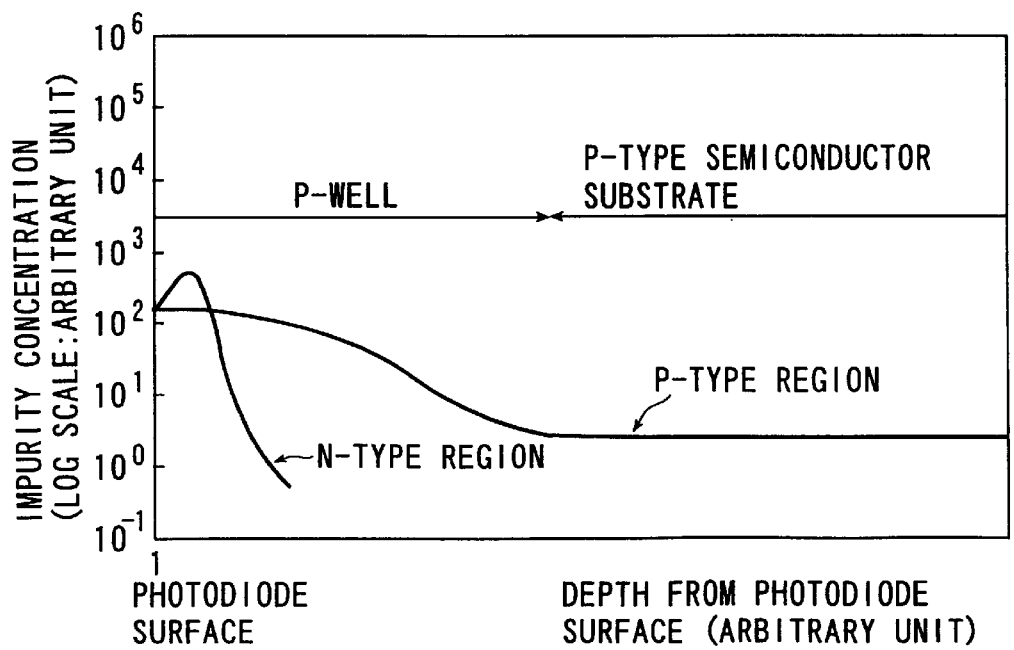

FIGS. 5A and 5B show impurity concentration profiles of the section of a photoelectric conversion portion (or photodiode portion) according to the present invention. N-type impurities in the N-type region are, for example, phosphorous (P) and P-type impurities in the P-type region are, for example, boron (B). In FIGS. 5A and 5B, the axis of ordinates indicates impurity concentration and the axis of abscissas indicates the depth from the surface of the photodiode.

FIG. 5B shows the concentration profile of prior art.

In FIG. 5B, a P-well and the N-type region of the photodiode are formed by conducting appropriate thermal diffusion after ions of conductive type determining impurities are injected. For that reason, the following problems occur:

(1) Since the P-type semiconductor substrate is low in concentration, the lifetime of electrons which serve as signal charges is long. Due to this, electrons thermally excited from the semiconductor substrate tend to concentrate on the photodiode, with the result that large amounts of current are diffused through the substrate to thereby increase dark current.

(2) Since the gradient of the concentration of the P-well becomes smaller toward the substrate, the signal charges (or electrons) generated within the P-well tend to be discharged to the substrate, resulting in low sensitivity.

(3) Since the signal charges entering the substrate easily leak into the lower part of the photodiodes of the adjacent pixels and part of the signal charges concentrate on the photodiodes of the adjacent pixels due to long substrate lifetime, color crosstalk and blooming tend to occur.

FIG. 5A shows concentration profiles in the first embodiment according to the present invention. As can be seen from FIG. 5A, contrary to prior art, the impurity concentration within the P-type semiconductor substrate becomes higher in the deeper portion from the surface of the photodiode according to the present invention. Here, the concentration of the high concentrated impurity region of the P-type semiconductor substrate according to the present invention needs to be $1\times10^{18}$ cm$^{-3}$ or higher so as to make the lifetime of electrons sufficiently short, in particular, preferably $3\times10^{18}$ cm$^{-3}$ or higher. The concentration gradient in the low concentrated impurity region is realized by diffusing impurities (B) from the substrate with the help of appropriate thermal process.

Figure 6:
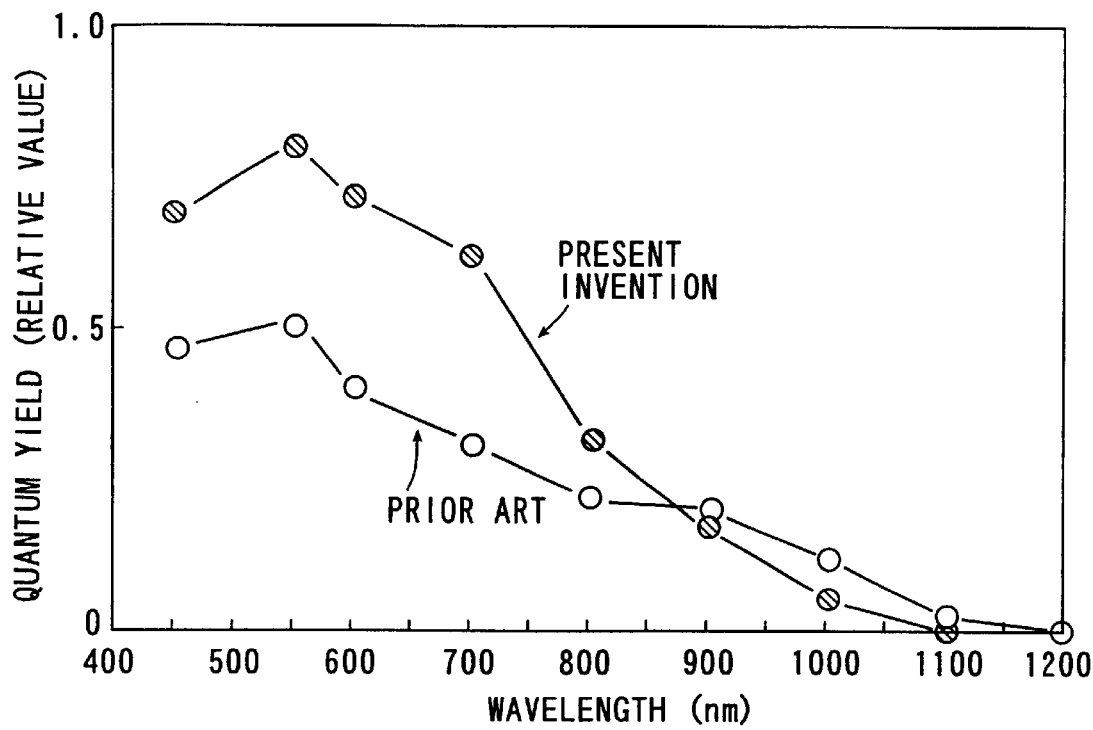
FIG. 6 is a chart for comparing the present invention with prior art in spectral sensitivity.

FIG. 6 is a chart for comparing the spectral sensitivity of the present invention and FIG. 5B to that of prior art.

As is obvious from FIG. 6, in case of the present invention, signal electrons generated in the concentration gradient by the concentration gradient formed in the low concentrated impurity region are converged into the photodiode and photo-sensitivity to visible light (800 nm or shorter in wavelength) is improved accordingly. Meanwhile, large amounts of infrared light (800 nm or longer in wavelength) are absorbed in the high concentrated impurity region deep in the substrate. The short lifetime therefore lowers quantum yield.

Figure 7:
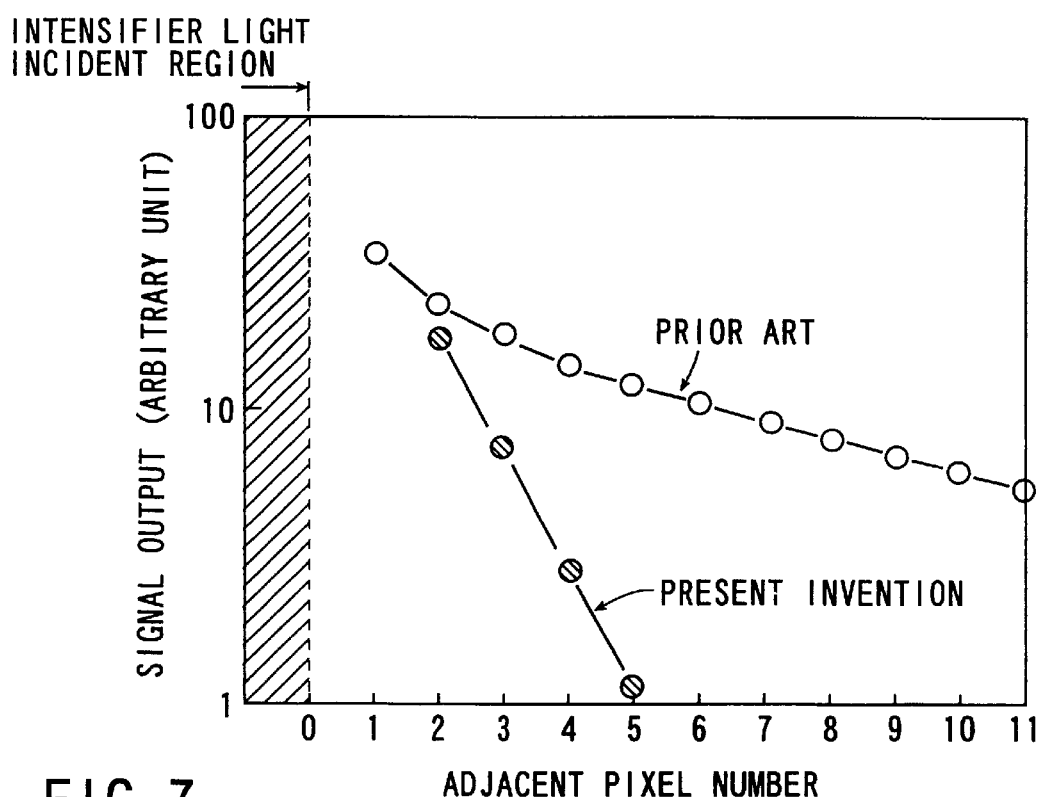
FIG. 7 is a chart for comparing the present invention with the prior art in blooming phenomenon in case where intensifier halogen light (about 100 times of the intensity of the light under standard imaging conditions) is incident.

FIG. 7 is a view for comparing the blooming phenomenon of the present invention to that of prior at in case where intensifier halogen light (about 100 times of the intensity of the light under standard imaging conditions) is incident. In FIG. 7, the axis of abscissas indicates the number of pixels adjacent to the intensifier light incident region (pixel). The adjacent pixels are kept to the dark period, thereby meaning that as higher the number, the farther the adjacent pixel from the incident region. The axis of ordinates indicates the signal output of the adjacent pixel in arbitrary units on logarithmic scales.

As can be seen from FIG. 7, signal output decrements logarithmically as it is farther away from the incident region and blooming phenomenon is controlled by the diffusion of signal charges in lateral direction. Thus, the present invention has a larger blooming suppression effect than that of prior art.

Figure 8:
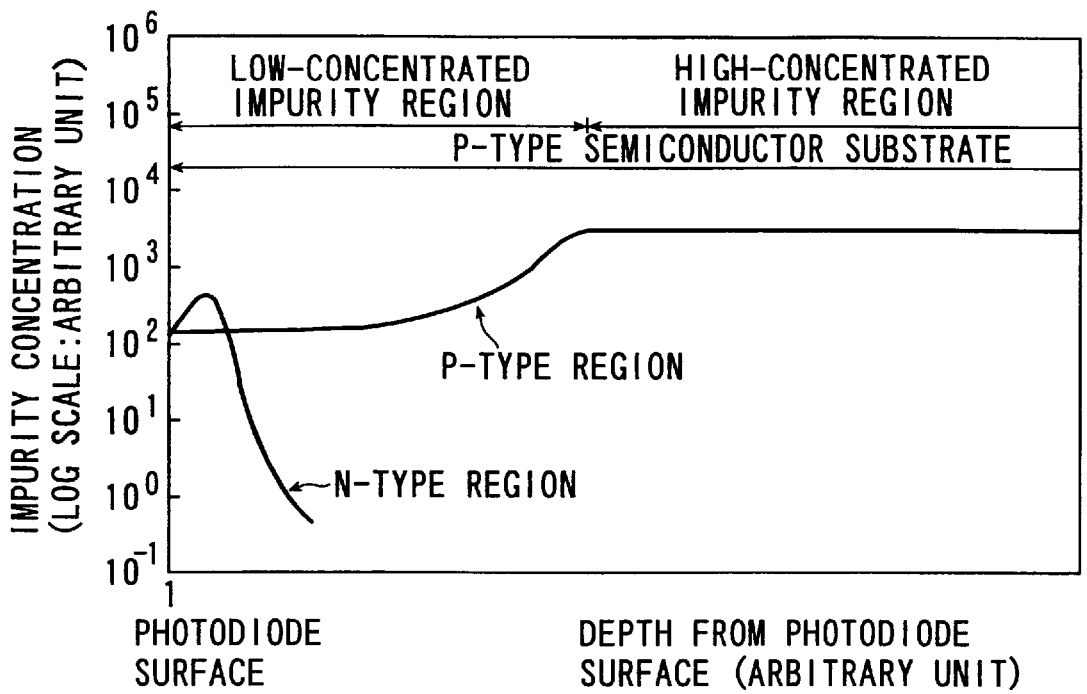
FIG. 8 is a concentration profile view of the solid-state image sensor in the second embodiment according to the present invention.

FIG. 8 shows the concentration profile of the solid-state image sensor in the second embodiment according to the present invention. The case shown in FIG. 8 differs from in FIG. 5A in that the P-well is not formed by ion implantation. In case of FIG. 8, a low concentrated impurity region in the P-type semiconductor substrate may be formed by changing a mixture ratio of boron dopant gas to material gas of SiH$_4$ or SiHCl$_3$ for example, epitaxial growth. In addition, the P-type region concentration of the photodiode is made to be almost equal to the P-well concentration shown in FIGS. 5A and 5B.

Figure 9:
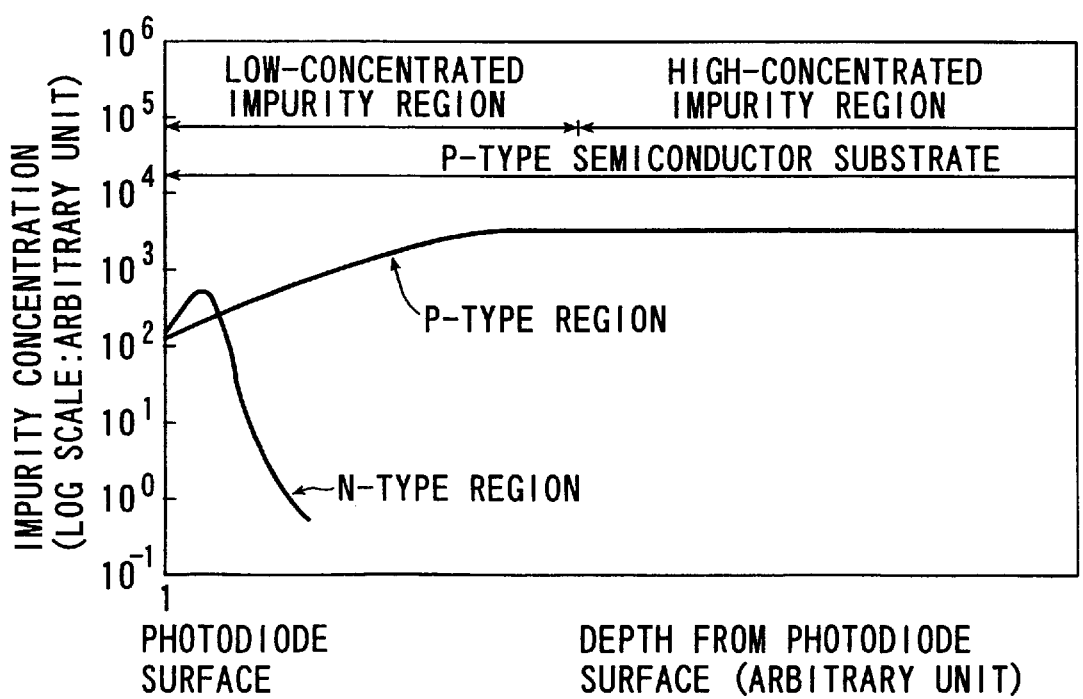
FIG. 9 is a concentration profile view of the solid-state image sensor in the third embodiment according to the present invention.

FIG. 9 shows the concentration profile of the solid-state image sensor in the third embodiment according to the present invention. This embodiment is characterized in that, as shown in FIG. 8, the concentration of the junction between the high concentrated impurity region and the low concentrated impurity region of the P-type semiconductor substrate is gradually changed due to use of thermal solid-phase diffusion. It is preferable, in this case, that solid phase diffusion temperature is set to between 1000° C. and 1300° C. and diffusion time is set between 10 and 480 minutes. The concentration of the P-type region of the photodiode is almost set to the P-well concentration as in the case of the second embodiment.

As illustrated by FIGS. 8 and 9, if the P-well is formed in the photodiode without ion implantation, no defects resulting from damages caused by ion implantation are generated. This embodiment, therefore, has an advantage in that the dark current of the photodiode can be further reduced.

Table 1 shows the dark current values and color crosstalk values of components shown in FIGS. 5A, 5B, 8 and 9. The numbers in Table 1 are relative values. Component color crosstalk is the relative value of the signal output of a most adjacent pixel to the light incident region which is kept to the dark period in case the light under standard imaging conditions is incident on an imaging region.

TABLE 1

| | dark current (relative value) | color crosstalk (relative value) |
|---|---|---|
| FIG. 5B | 1.0 | 1.0 |
| FIG. 5A | 0.8 | 0.8 |
| FIG. 8 | 0.5 | 0.75 |
| FIG. 9 | 0.4 | 0.7 |

It goes without saying that the present invention is capable of greatly improving photo-sensitivity and effectively preventing blooming as stated before.

Figure 10:
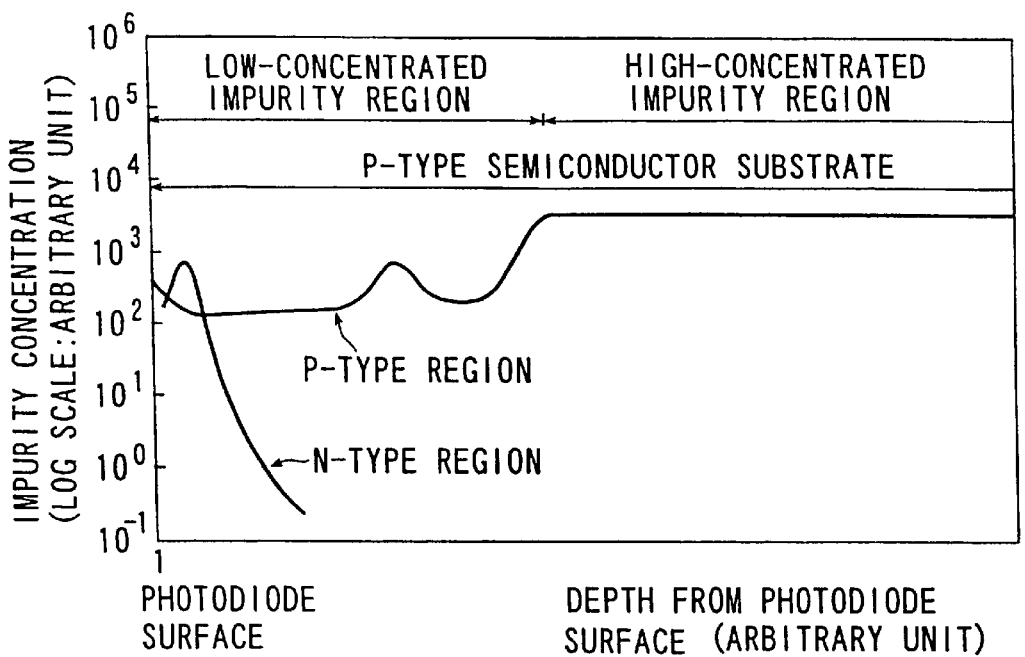
FIG. 10 shows a case where the P-type impurity concentration profile in the low concentrated impurity region differ from those in the preceding embodiments.

Further, as shown in FIG. 10, even if the P-type impurity concentration profile is somewhat projected in the low concentrated impurity region, the present invention is of course effective.

Figure 11:
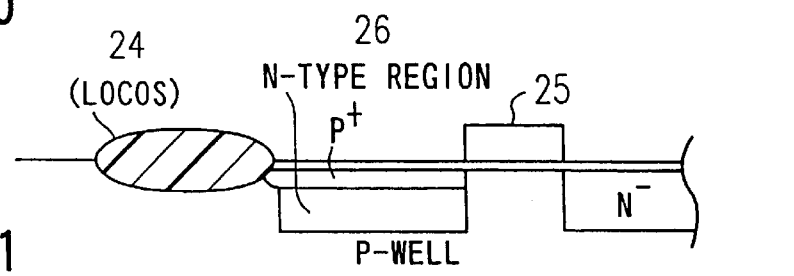
FIG. 11 is a cross-sectional view of a surface shield sensor to which the present invention is applied.

The present invention is also applicable to a surface shield sensor. The surface shield sensor has a structure as shown in, for example, FIG. 11. In FIG. 11, the same elements as those in FIG. 2 are denoted by the same reference numerals.

Figure 1:
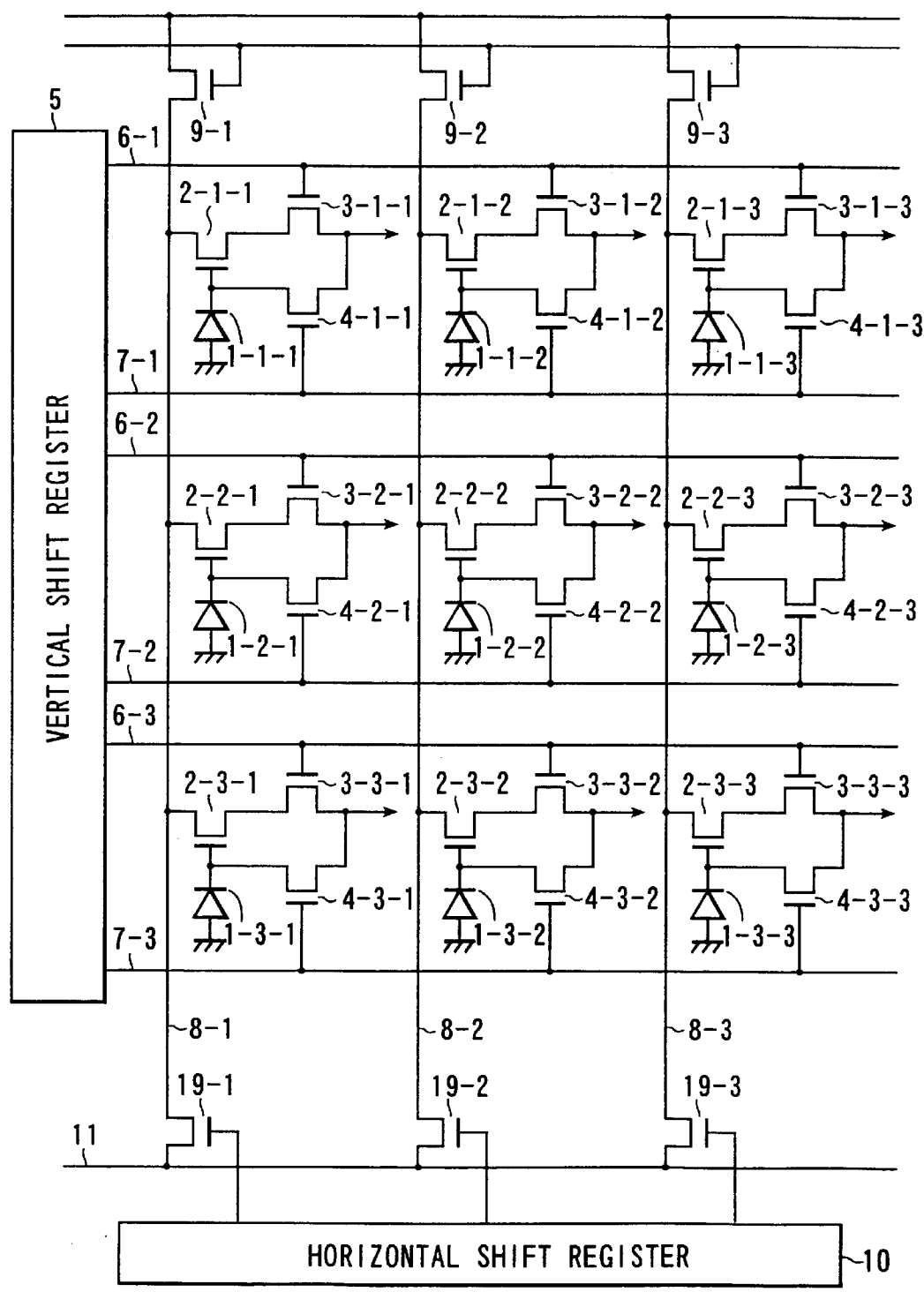
FIG. 1 is an example of the circuit diagram of a solid-state image sensor called an amplifying MOS sensor.
Figure 2:
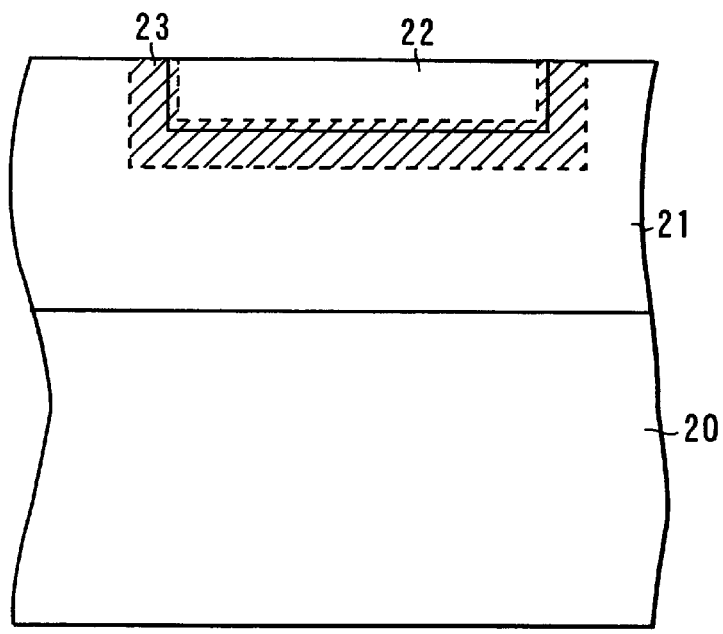
FIG. 2 is an example of the sectional structure of the conventional photodiode.
Figure 4:
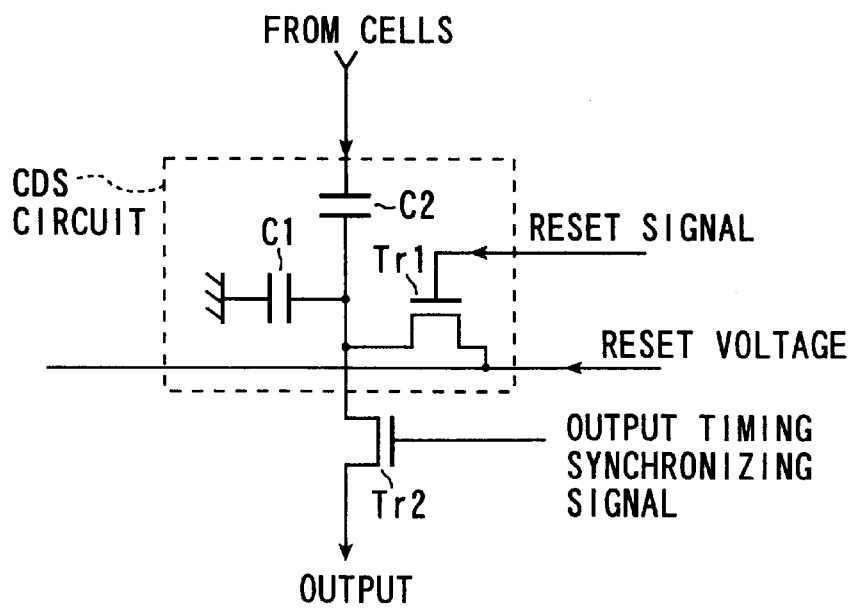
FIG. 4 shows a specific example of a noise canceler.
Figure 3:
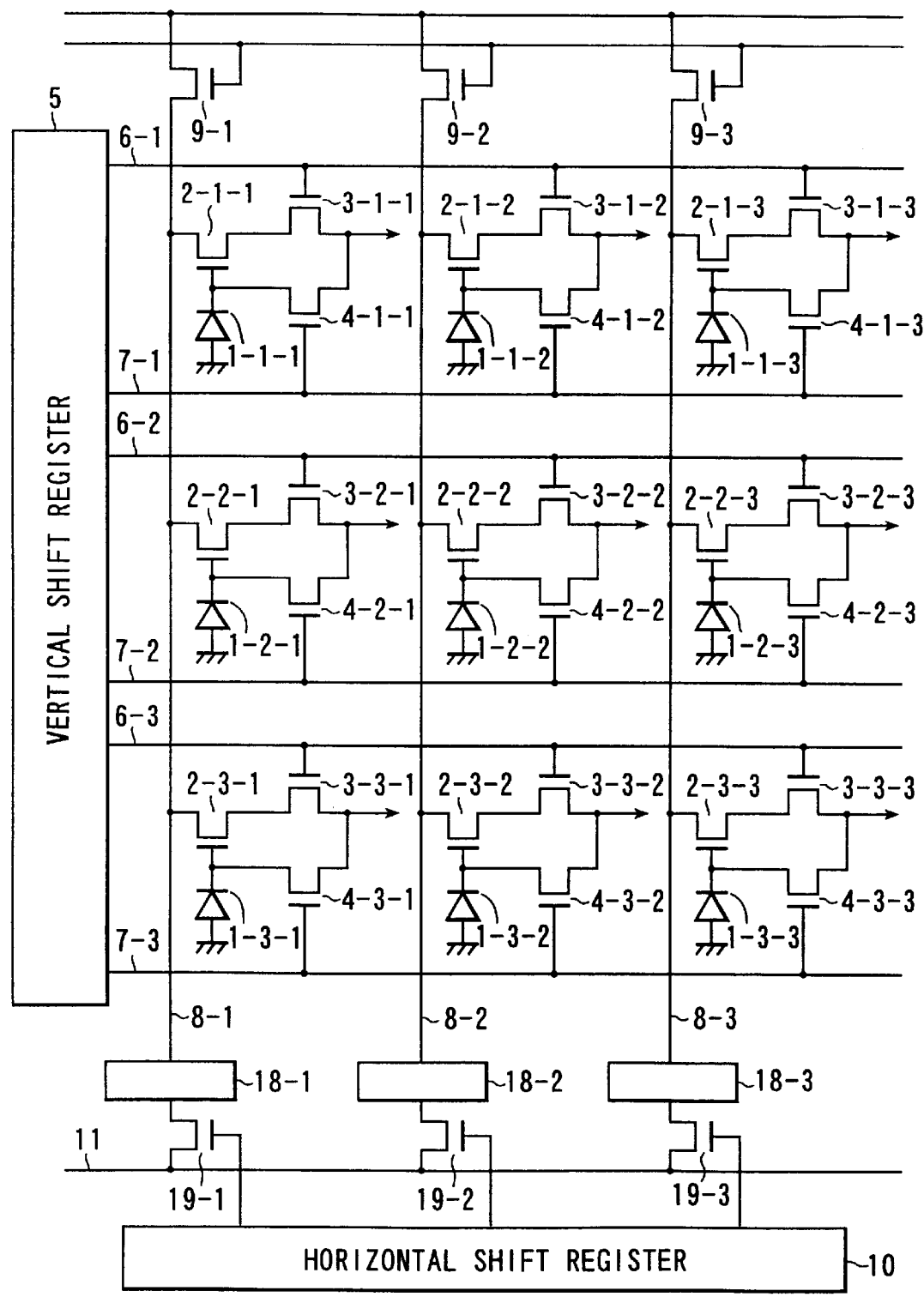
FIG. 3 is a circuit diagram wherein noise cancelers are added to the solid-state image sensor of FIG. 1.

In the surface shield sensor of FIG. 11, an N-type region is formed above a P-well as in the case of FIG. 2. Moreover, a $P^+$ layer is formed above the N-type region by, for example, boron (B) implantation. Since the $P^+$ layer is formed above the N-type region, the effect of reducing dark current can be obtained. As shown in FIG. 11, there are also provided an component isolation film 24 for isolating components, a read gate 25 for signal charge transfer and a storage portion 26 for storing the signal charges read by the read gate 25.

Figure 12:
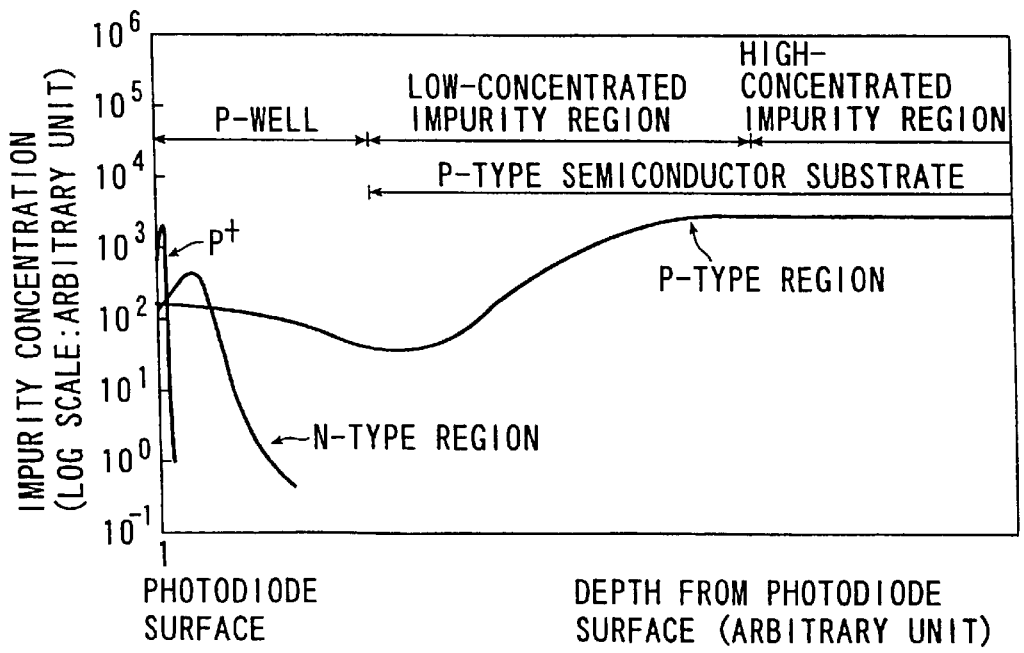
FIG. 12 is a concentration profile view of the solid-state image sensor in case where the present invention is applied to the surface shield sensor of FIG. 11.

An impurity concentration profile in case where the present invention is applied to the surface shield sensor having the structure of FIG. 11 is illustrated by FIG. 12.

In FIG. 12, the impurity concentration within the P-type semiconductor substrate is set higher as deeper from the surface of the photodiode as in the case of the first to third embodiments. By so doing, the same advantages as in the first to third embodiments can be obtained. In the fourth embodiment, it is possible to employ any of the methods in the first to third embodiments.

If the present invention is applied, it is possible to lower the resistance of the semiconductor substrate itself, whereby the high-speed operation of the noise cancelers, which are essential to the amplifying MOS sensor, can be realized. As a result, even if the horizontal blanking period becomes short, fixed pattern noise inherent to the amplifying MOS sensor can be removed. In other words, a highly refined multiple-pixel component (of 1.3 million pixels or more) can be realized by the present invention.

In the first to fourth embodiments, it is preferable that the length in the direction of the depth of the P-well region is in the range between 0 $\mu$m and 6 $\mu$m and that the length in the direction of the depth of the low concentrated impurity region of the P-type semiconductor substrate is in the range between 1 $\mu$m and 5 $\mu$m (more preferably between 2 $\mu$m and 10 $\mu$m). It is not preferable that the present invention is applied to a case where the length in the direction of the depth of the low concentrated impurity region of the P-type semiconductor substrate is beyond the above range. This is because, in the latter case, the concentration gradient is too small and the advantages of the present invention cannot be therefore expected.

The present invention should not be limited to the above-stated embodiments. It is of course possible to modify these embodiments while avoiding departing from the spirit of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A solid-state image sensor comprising:

a semiconductor substrate;

a photoelectric conversion portion formed above said semiconductor substrate; and noise cancelers each formed adjacent to said photoelectric conversion portion, configured to remove noise of a signal read from said photoelectric conversion portion, wherein said semiconductor substrate has a conductivity type such that carriers of said signal are minority charge carriers, and has a first region and a second region, a concentration of impurities of said second region is lower than that of said first region, said impurity concentration in said second region is gradually lower toward a surface of said semiconductor substrate, and said impurity concentration in said first region is $1 \times 10^{18}$ $cm^{-3}$ or higher.

2. A solid-state image sensor according to claim 1, wherein said second region is an epitaxial growth layer.

3. A solid-state image sensor according to claim 1, wherein said second region is a thermal solid-phase diffusion layer; and said impurities are diffused from said first region toward said second region to thereby provide said impurity concentration in said second region with a desired concentration gradient.

4. A solid-state image sensor comprising:

a semiconductor substrate;

a photoelectric conversion portion formed above said semiconductor substrate;

a third region formed above said photoelectric conversion portion, having a same conductivity type as that of a first region and having almost a same impurity concentration as that of said first region; and noise cancelers each formed adjacent to said photoelectric conversion portion, configured to remove noise of a signal read from said photoelectric conversion portion, wherein said semiconductor substrate has a conductivity type such that carriers of said signal are minority charge carriers, and has said first region where a concentration of impurities determining said conductivity type is high and a second region where a concentration of said impurities in said first region is low, said impurity concentration in said second region is gradually lower toward a surface of said semiconductor substrate, and said impurity concentration in said first region is $1 \times 10^{18}$ $cm^{-3}$ or higher.

5. A solid-state image sensor according to claim 4, wherein said second region is an epitaxial growth layer.

6. A solid-state image sensor according to claim 4, wherein said second region is a thermal solid-phase diffusion layer; and said impurities are diffused from said first region toward said second region to thereby provide said impurity concentration in said second region with a desired concentration gradient.

* * * * *